US009513813B1

(12) United States Patent
Blaettler et al.

(10) Patent No.: US 9,513,813 B1
(45) Date of Patent: Dec. 6, 2016

(54) DETERMINING PREFIX CODES FOR PSEUDO-DYNAMIC DATA COMPRESSION UTILIZING CLUSTERS FORMED BASED ON COMPRESSION RATIO

(71) Applicant: INTERNATIONAL BUSINESS MACHINES CORPORATION, Armonk, NY (US)

(72) Inventors: Tobias Blaettler, Maur (CH); Thomas Mittelholzer, Zurich (CH); Nikolaos Papandreou, Thalwil (CH); Thomas Parnell, Zurich (CH); Charalampos Pozidis, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/975,153

(22) Filed: Dec. 18, 2015

(51) Int. Cl.
*G06F 12/00* (2006.01)
*G06F 3/06* (2006.01)

(52) U.S. Cl.
CPC ........... *G06F 3/0608* (2013.01); *G06F 3/0638* (2013.01); *G06F 3/0673* (2013.01)

(58) Field of Classification Search
None
See application file for complete search history.

(56) References Cited

U.S. PATENT DOCUMENTS

| | | |
|---|---|---|
| RE41,152 E | 2/2010 | Reynar et al. |
| 8,665,988 B2 | 3/2014 | Yu et al. |
| 2009/0174583 A1 | 7/2009 | Diaz-Gutierrez et al. |
| 2010/0281079 A1 | 11/2010 | Marwah et al. |
| 2011/0158323 A1 | 6/2011 | Chen et al. |
| 2012/0131029 A1 | 5/2012 | Laine |
| 2013/0222159 A1 | 8/2013 | Nesiolovskiy et al. |
| 2015/0113220 A1* | 4/2015 | Amit ............ H03M 7/42 711/122 |
| 2015/0162936 A1 | 6/2015 | Lauther |

FOREIGN PATENT DOCUMENTS

EP 1764728 A1 3/2007

OTHER PUBLICATIONS

Pajarola et al., "Fast Prefix Code Processing", Renato Pajarola, Information & Computer Science University of California, Irvine pajarola@acm.org, IEEE ITCC Conference, pp. 206-211, 2003.

(Continued)

*Primary Examiner* — Duc Doan
(74) *Attorney, Agent, or Firm* — Brian F. Russell; Randall J. Bluestone

(57) ABSTRACT

A set of K prefix codes for use in pseudo-dynamic compression are determined by seeding each of K clusters with a respective one of K data pages selected from a training data set, where K is a positive integer greater than 1. For each of the K randomly selected data pages, a prefix code is determined for its cluster utilizing Huffman encoding. Each remaining data page of the training data set is assigned to one of the K clusters whose prefix code yields the highest compression ratio. For each of the K clusters, the prefix code is updated by performing Lempel-Ziv (LZ) encoding on all pages assigned to that cluster, forming a sequence from results of the LZ encoding, and extracting an updated prefix code for the cluster from the sequence utilizing Huffman encoding. The set of K prefix codes determined for the K clusters is then output.

20 Claims, 7 Drawing Sheets

(56) References Cited

OTHER PUBLICATIONS

Moffat et al., "On the Implementation of Minimum Redundancy Prefix Codes", Alistair Moffat and Andrew Turpin (see sections IV, V, VI). IEEE Transactions on Communications, vol. 45, No. 10, Oct. 1997.

* cited by examiner

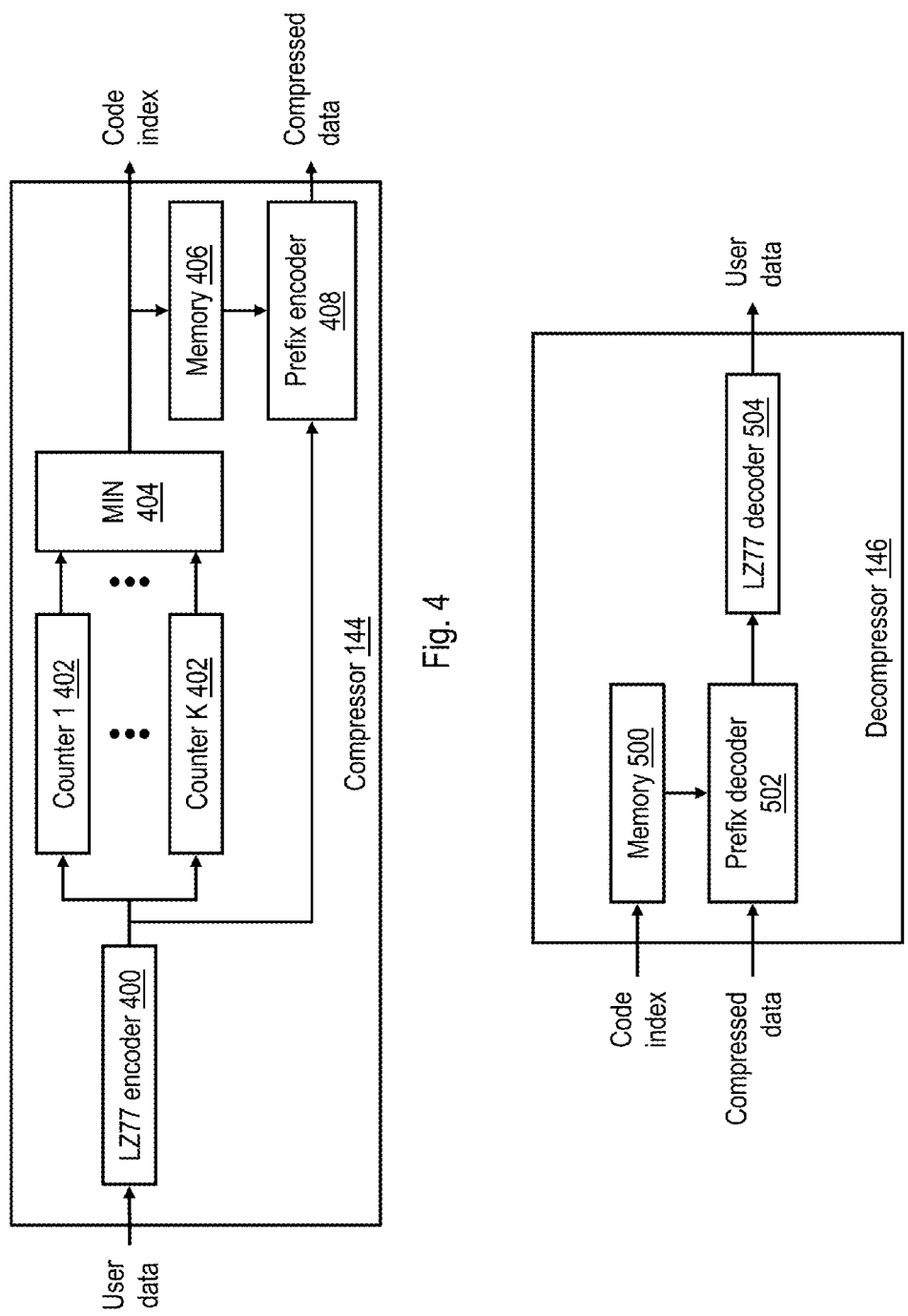

DETERMINING PREFIX CODES FOR PSEUDO-DYNAMIC DATA COMPRESSION UTILIZING CLUSTERS FORMED BASED ON COMPRESSION RATIO

BACKGROUND OF THE INVENTION

This disclosure relates to data processing and data storage, and more specifically, to determining prefix codes for pseudo-dynamic data compression utilizing clusters formed based on compression ratio.

Data storage systems commonly employ data compression to increase the effective storage capacity of the physical storage media within the data storage system. One common data compression technique employed in GZIP compression is dynamic Huffman compression. A data compressor that employs a dynamic Huffman compression architecture encodes input data blocks (also referred to herein as "data pages") utilizing a Lempel-Ziv77 (LZ77) encoder, extracts an optimal Huffman code for each LZ77-encoded data page, and then encodes each LZ77-encoded data page utilizing the optimal Huffman code for that data page to obtain compressed output data. The outputs of a dynamic Huffman compressor include the compressed output data and a code description of the optimal Huffman code utilized to encode each data page.

GZIP and other dynamic Huffman encoders are widely used due in part to their generally robust compression performance. However, reconstructing the optimal Huffman code from the code description during decompression is a time-consuming process that increases data access latency. In addition, for small data pages, the length of the code description, which may be on the order of hundreds of bytes, is significant compared to the length of the compressed data page and therefore adversely impacts the compression ratio achieved.

In light of the drawbacks associated with dynamic Huffman encoders, pseudo-dynamic compression can be utilized as an alternative. A pseudo-dynamic compressor may also encode input data pages with an LZ77 encoder, but utilizes a fixed set of K prefix codes to encode the LZ77-encoded data pages. The outputs of a pseudo-dynamic compressor include the compressed output data and a code index identifying which of the K prefix codes was used to encode each data page. Because the prefix codes are predetermined, there is no decompression latency penalty associated with reconstructing the optimal Huffman code for each data page from the code description. Instead, the prefix codes can be accessed via a simple memory lookup utilizing the code index. In addition, the code index, which can be on the order of two bytes or less, is significantly shorter than the code description of the optimal Huffman codes.

A key factor in the compression performance achieved by pseudo-dynamic compressors is the choice of the K prefix codes. In US 2013/01135123 A1, a technique for generating the K prefix codes is described in which K groups of data blocks having similar literal frequencies at the output of an LZ77 encoder are formed and then the conventional Huffman algorithm is utilized to determine an optimal prefix code for each data group. The present disclosure recognizes that this technique tends to be inefficient in the construction of the K groups. US 2015/0162936 A1 discloses an alternative technique in which the K groups are instead formed on the basis of an entropy computation. However, the present disclosure recognizes that formation of the K groups based on entropy does not in all cases yield the greatest compression ratio.

BRIEF SUMMARY

The present disclosure discloses a technique of determining a set of K prefix codes for use in pseudo-dynamic compression. According to the disclosed technique, each of K clusters is seeded with a respective one of K data pages selected from a training data set, where K is a positive integer greater than 1. For each of the K randomly selected data pages, a prefix code is determined for its cluster utilizing Huffman encoding. Each remaining data page of the training data set is assigned to one of the K clusters whose prefix code yields the highest compression ratio. For each of the K clusters, the prefix code is updated by performing Lempel-Ziv (LZ) encoding on all pages assigned to that cluster, forming a sequence from results of the LZ encoding, and extracting an updated prefix code for the cluster from the sequence utilizing Huffman encoding. The set of K prefix codes determined for the K clusters is then output. Because the K prefix codes are selected based on the compression ratio achieved, the pseudo-dynamo compression ratio is explicitly optimized.

In addition to implementation as a process, the disclosed technique can be realized in a data processing system, which can be, for example, a processor system or data storage system. In this embodiment, control logic is configured to seed each of K clusters with a respective one of K data pages selected from a training data set, where K is a positive integer greater than 1. The control logic is configured to determine, for each of the K randomly selected data pages, a prefix code for its cluster utilizing Huffman encoding. The control logic is configured to assign each remaining data page of the training data set to one of the K clusters whose prefix code yields the highest compression ratio. The control logic is configured, for each of the K clusters, to update the prefix code by performing Lempel-Ziv (LZ) encoding on all pages assigned to that cluster, forming a sequence from results of the LZ encoding, and extracting an updated prefix code for the cluster from the sequence utilizing Huffman encoding. The control logic can then output the set of K prefix codes determined for the K clusters.

In addition to implementation as a process and a data processing system, the disclosed technique can be realized in a computer program product comprising a computer readable storage medium having program instructions embodied therewith. The program instructions are executable by control logic to cause the control logic to perform determining a set of K prefix codes for pseudo-dynamic compression. The determining includes seeding each of K clusters with a respective one of K data pages selected from a training data set, wherein K is a positive integer greater than 1; for each of the K randomly selected data pages, determining an prefix code for its cluster utilizing Huffman encoding; assigning each remaining data page of the training data set to one of the K clusters whose prefix code yields the highest compression ratio; and for each of the K clusters, updating the prefix code by performing Lempel-Ziv (LZ) encoding on all pages assigned to that cluster, forming a sequence from results of the LZ encoding, and extracting an updated prefix code for the cluster from the sequence utilizing Huffman encoding. The program instructions further cause the control logic to output the set of K prefix codes determined for the K clusters.

In accordance with one embodiment, the K prefix codes determined by the disclosed technique can be set the K prefix codes in a pseudo-dynamic compressor of a data storage system.

In accordance with one embodiment, the determining is repeated for multiple different values of K to obtain multiple different sets of prefix codes and the output set of K prefix codes provides a highest compression ratio. In at least some embodiments, the compression ratio for each of the multiple different sets of prefix codes are determined utilizing a test data set different from the training data set.

In accordance with one embodiment, the seeding is performed in each of multiple iterations of the determining step for a same value of K and the output set of K prefix codes provides a highest compression ratio.

In accordance with one embodiment, the assigning and updating are performed in each of multiple iterations of the determining step for a same value of K and the output set of K prefix codes provides a highest compression ratio.

In accordance with one embodiment, the determining and outputting are performed by control logic of a data storage system dynamically during operation of data storage system.

BRIEF DESCRIPTION OF THE SEVERAL VIEWS OF THE DRAWINGS

FIG. 4 depicts an exemplary compressor in accordance with one embodiment;

FIG. 5 illustrates an exemplary decompressor in accordance with one embodiment;

DETAILED DESCRIPTION

Figure 1A:
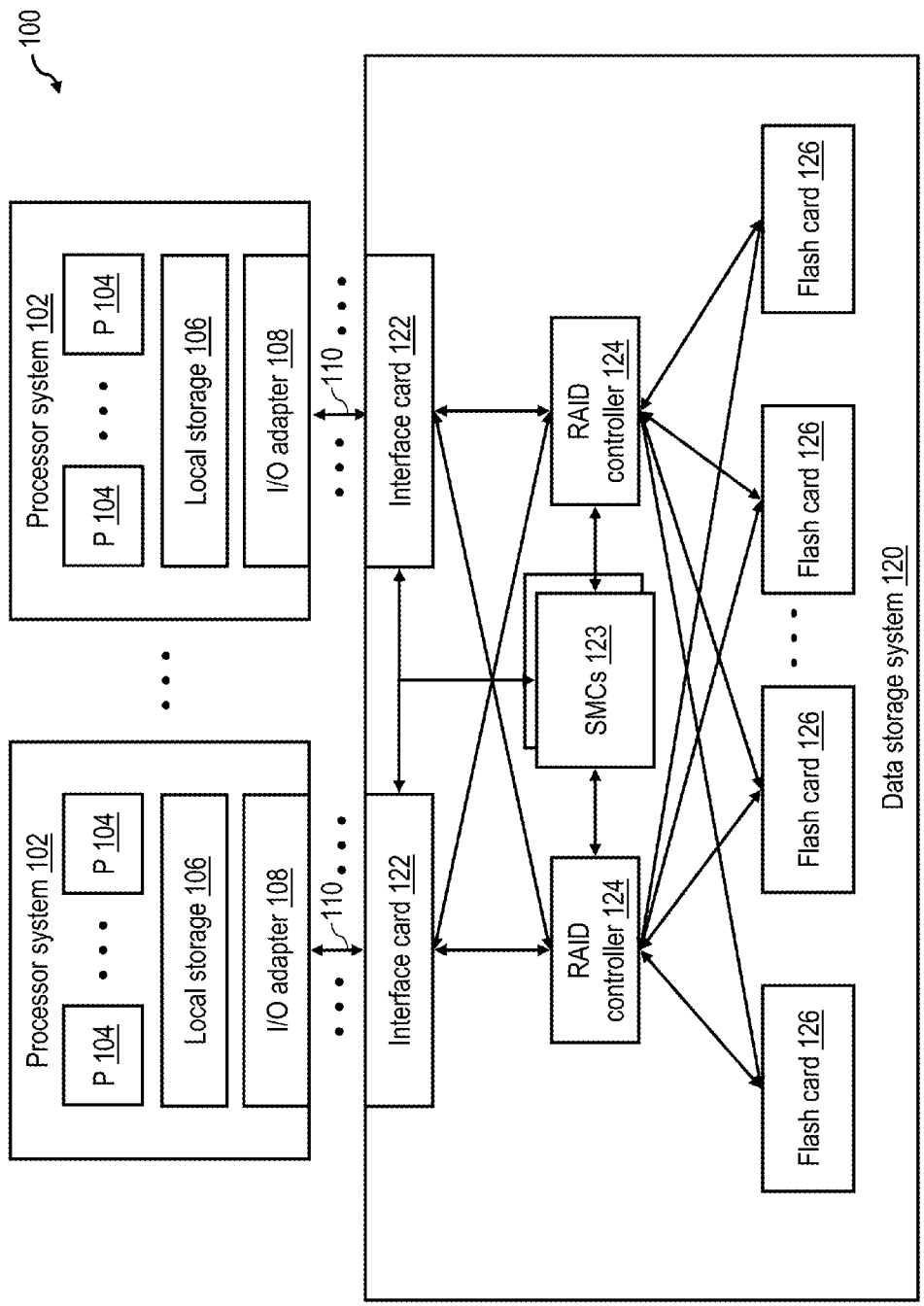
FIG. 1A is a high level block diagram of a data processing environment in accordance with one embodiment.

With reference to the figures and with particular reference to FIG. 1A, there is illustrated a high level block diagram of an exemplary data processing environment 100 including a data storage system 120 having a non-volatile memory array as described further herein. As shown, data processing environment 100 includes one or more hosts, such as a processor system 102 having one or more processors 104 that process instructions and data. A processor system 102 may additionally include local storage 106 (e.g., dynamic random access memory (DRAM) or disks) that may store program code, operands and/or execution results of the processing performed by processor(s) 104. In various embodiments, a processor system 102 can be, for example, a mobile computing device (such as a smartphone or tablet), a laptop or desktop personal computer system, a server computer system (such as one of the POWER series of servers available from International Business Machines Corporation), or a mainframe computer system. A processor system 102 can also be an embedded processor system using various processors such as ARM, PowerPC, Intel X86, or any other processor combined with memory caches, memory controllers, local storage, I/O bus hubs, etc.

Each processor system 102 further includes an input/output (I/O) adapter 108 that is coupled directly (i.e., without any intervening device) or indirectly (i.e., through at least one intermediate device) to a data storage system 120 via an I/O channel 110. In various embodiments, I/O channel 110 may employ any one or a combination of known or future developed communication protocols, including, for example, Fibre Channel (FC), FC over Ethernet (FCoE), Internet Small Computer System Interface (iSCSI), Infini-Band, Transport Control Protocol/Internet Protocol (TCP/IP), Peripheral Component Interconnect Express (PCIe), etc. I/O operations (IOPs) communicated via I/O channel 110 include read IOPs by which a processor system 102 requests data from data storage system 120 and write IOPs by which a processor system 102 requests storage of data in data storage system 120.

Although not required, in the illustrated embodiment, data storage system 120 includes multiple interface cards 122 through which data storage system 120 receives and responds to input/output operations (TOP) of hosts via I/O channels 110. Each interface card 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to non-volatile storage media, which in the illustrated example include multiple flash cards 126 bearing NAND flash memory. In other embodiments, alternative and/or additional non-volatile storage devices can be employed.

In the depicted embodiment, the operation of data storage system 120 is managed by redundant system management controllers (SMCs) 123, which are coupled to interface cards 122 and RAID controllers 124. In various embodiments, system management controller 123 can be implemented utilizing hardware or hardware executing firmware and/or software.

Figure 1B:
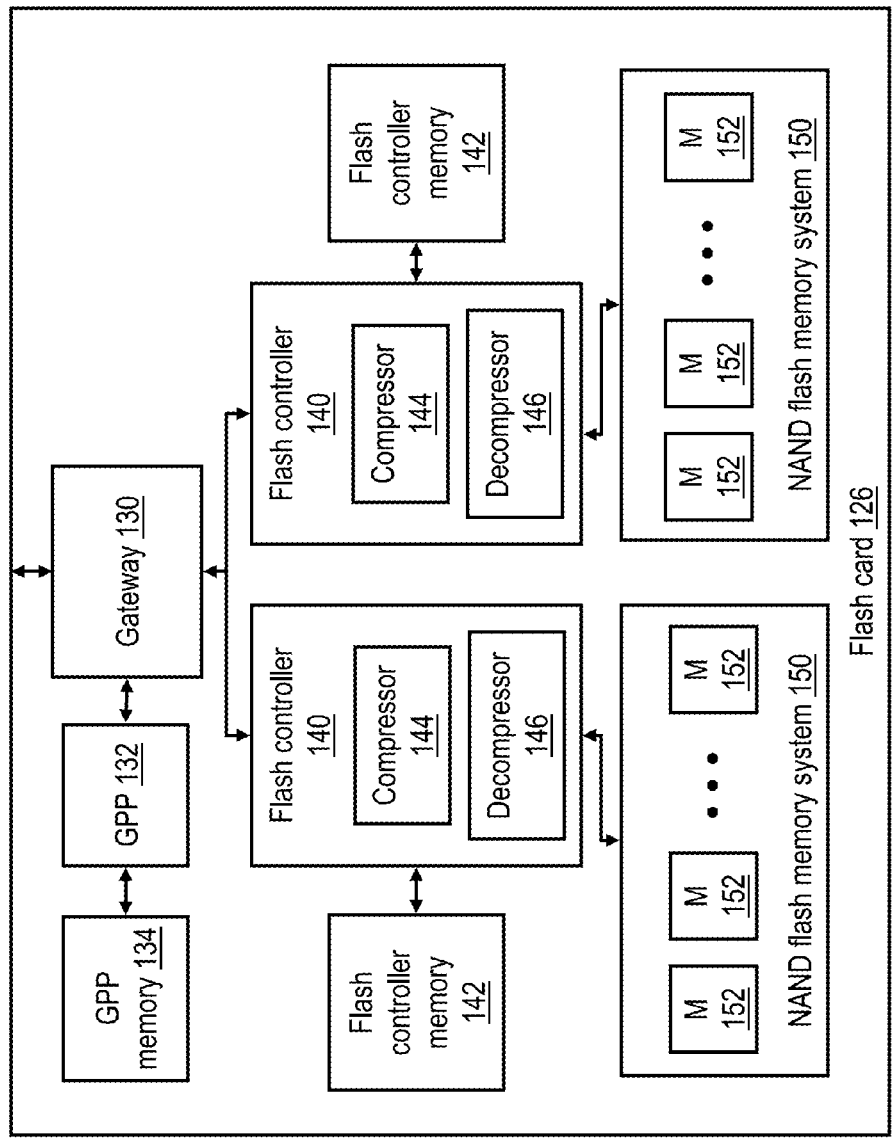
FIG. 1B is a more detailed block diagram of a flash card of the data storage system of FIG. 1A.

FIG. 1B depicts a more detailed block diagram of an exemplary embodiment of a flash card 126 of data storage system 120 of FIG. 1A. Flash card 126 includes a gateway 130 that serves as an interface between flash card 126 and RAID controllers 124. Gateway 130 is coupled to a general-purpose processor (GPP) 132, which can be configured (e.g., by program code) to perform pre-processing on IOPs received by gateway 130 and/or to schedule servicing of the IOPs by flash card 126. GPP 132 is coupled to a GPP memory 134 (e.g., Dynamic Random Access Memory (DRAM)) that can conveniently buffer data created, referenced and/or modified by GPP 132 in the course of its processing or data flowing through the gateway 130 destined for one or more of the flash controllers 140.

Gateway 130 is further coupled to multiple flash controllers 140, each of which controls a respective NAND flash memory system 150. Flash controllers 140 can be implemented, for example, by an Application Specific Integrated Circuit (ASIC) and/or a Field Programmable Gate Array (FPGA) and/or a microprocessor, and each have an associated flash controller memory 142 (e.g., DRAM). In embodiments in which flash controllers 140 are implemented with an FPGA, GPP 132 may program and configure flash controllers 140 during start-up of data storage system 120. After startup, in general operation flash controllers 140 receive read and write IOPs from gateway 130 that request to read data stored in NAND flash memory system 150 and/or to store data in NAND flash memory system 150. Flash controllers 140 service these IOPs, for example, by accessing NAND flash memory system 150 to read or write the requested data from or into NAND flash memory system 150 or by accessing a memory cache (not illustrated) associated with NAND flash memory system 150.

Flash controllers 140 implement a flash translation layer (FTL) that provides logical-to-physical address translation to enable access to specific memory locations within NAND flash memory systems 150. In general, an IOP received by flash controller 140 from a host device, such as a processor system 102, contains the logical block address (LBA) at which the data is to be accessed (read or written) and, if a write IOP, the write data to be stored to data storage system 120. The IOP may also specify the amount (or size) of the data to be accessed. Other information may also be communicated depending on the protocol and features supported by data storage system 120. The flash translation layer translates LBAs received from a RAID controller 124 into physical addresses assigned to corresponding physical location in NAND flash memory systems 150. Flash controllers 140 may perform address translation and/or store mappings between logical and physical addresses in a logical-to-physical translation data structure, such as a logical-to-physical translation table (LPT), which may conveniently be stored in flash controller memory 142.

NAND flash memory systems 150 may take many forms in various embodiments. In the embodiment shown in FIG. 1B, each NAND flash memory system 150 includes multiple (e.g., 32) individually addressable NAND flash memory storage devices 152. In the illustrated example, the flash memory storage devices 152 take the form of a board-mounted flash memory modules, for example, Single Level Cell (SLC), Multi-Level Cell (MLC), Three Level Cell (TLC), or Quad Level Cell (QLC) NAND flash memory modules. The effective storage capacity provided by flash memory storage devices 152 is preferably increased through the implementation of data compression, for example, by flash controllers 140 and/or high level controllers, such as GPPs 132 or RAID controllers 124. In the illustrated embodiment, data compression and decompression is implemented at least in flash controllers 140 by a compressor 144 and decompressor 146.

Figure 2:
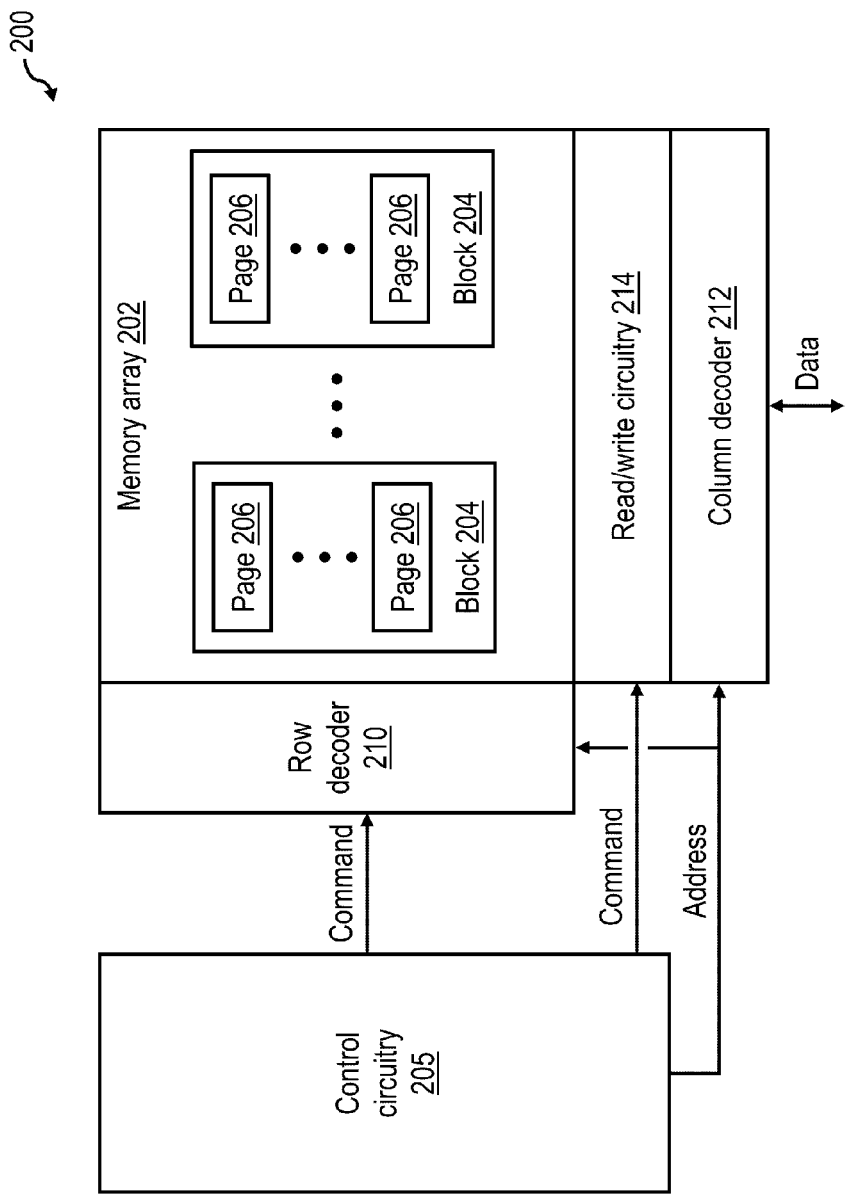
FIG. 2 depicts an exemplary NAND flash memory module in accordance with one embodiment.

Referring now to FIG. 2, there is depicted a block diagram of an exemplary flash memory module 200 that can be utilized to implement any of the NAND flash memory storage devices 152 of FIG. 1B. Flash memory module 200 includes one or more memory die, each implementing at least one memory array 202 formed of a two- or three-dimensional array of NAND flash memory cells. As indicated in FIG. 2, the memory cells within memory array 202 are physically arranged in multiple blocks 204, each in turn including multiple physical pages 206.

As is known to those skilled in the art, NAND flash memory, such as that employed in memory array 202, must be erased prior to being programmed. Further, NAND flash memory is generally constrained by its construction such that the smallest granule of storage that can be erased is a block 204 and the smallest granule of storage that can be accessed by a read or write IOP is fixed at the size of a single physical page 206. It should be appreciated in this regard that the LBAs provided by host devices correspond to logical pages within a logical address space, where each logical page typically has a size of 4 kilobytes (kB). Physical pages 206, in contrast, typically have a larger size, for example, 16 kB, and can thus correspond to multiple logical pages.

Flash memory module 200 further includes a row decoder 210 through which word lines of memory array 202 can be addressed and a column decoder 212 through which bit lines of memory array 202 can be addressed. In addition, flash memory module 200 includes read/write circuitry 214 that enables the memory cells of a physical page 206 to be programmed or read in parallel. Flash controller 200 additionally includes control circuitry 205 that provides chip-level control of operation of memory array 202, including read and write accesses made to physical pages 206 in memory array 202, erasure of blocks 204, and the amplitude, duration and polarity of related voltages applied to memory array 202.

Having described the general physical structure of one exemplary embodiment of a data storage system 120, certain operational aspects of data storage system 120 are now described with reference to FIG. 3, which is a high level flow diagram of the flash management functions and data structures employed by a GPP 132 and/or flash controller 140 in accordance with one embodiment.

Data storage system 120 does not generally allow external devices (e.g., hosts) to directly address and/or access the physical memory locations within NAND flash memory systems 150. Instead, data storage system 120 is generally configured to present to host devices one or more logical volumes each having a contiguous logical address space, thus allowing host devices to read and write data to and from LBAs within the logical address space while permitting one or more of the various levels of controllers (e.g., system management controller 123, RAID controllers 124, flash controllers 140 and GPP 132) to control where the data that is associated with the various LBAs actually resides in the physical memory locations comprising NAND flash memory systems 150. In this manner, performance and longevity of NAND flash memory systems 150 can be intelligently managed and optimized. In the illustrated embodiment, each flash controller 140 performs logical-to-physical address translation for an associated set of LBAs using a logical-to-physical address translation data structure, such as logical-to-physical translation (LPT) table 300, which can be stored, for example, in the associated flash controller memory 142. It should be noted that the logical address supplied to flash controller(s) 140 may be different from the logical address originally supplied to data storage system 120, since various components within data storage system 120 may perform address translation operations between the external devices and the flash controller(s) 140.

Flash management code running on the GPP 132 tracks erased blocks of NAND flash memory system 150 that are ready to be used in ready-to-use (RTU) queues 306, which may be stored, for example, in GPP memory 134. In the depicted embodiment, flash management code running on the GPP 132 maintains one RTU queue 306 per channel (i.e., per data bus), and an identifier of each erased block that is to be reused is enqueued in the RTU queue 306 corresponding to its channel. A build block stripes function 320 performed by flash management code running on the GPP 132 constructs new block stripes for storing data and associated parity information from the erased blocks enqueued in RTU queues 306. The new block stripes are then queued to the flash controller 140 for data placement. Block stripes are preferably formed of blocks residing in different channels, meaning that build block stripes function 320 can conveniently construct a block stripe by drawing each block of the new block stripe from a different RTU queue 306. In general, build block stripes function 320 attempts to construct stripes from blocks of approximately equal health (i.e., expected remaining useful life).

In response to write IOP received from a host, such as a processor system 102, a data placement function 310 of flash controller 140 determines by reference to LPT table 300 whether the target LBA(s) indicated in the write request is/are currently mapped to physical memory page(s) in NAND flash memory system 150 and, if so, changes the status of each data page currently associated with a target LBA to indicate that the associated data is no longer valid. In addition, data placement function 310 allocates a page stripe if necessary to store the write data of the write IOP and any non-updated data (i.e., for write requests smaller than a logical page, the remaining valid data from a previous write to the same logical address which is not being overwritten and which must be handled in a read-modify-write manner) from an existing page stripe, if any, targeted by the write IOP, and/or stores the write data of the write IOP and any non-updated (i.e., still valid) data from an existing page stripe, if any, targeted by the write IOP to an already allocated page stripe which has free space left. The page stripe may be allocated from either a block stripe already allocated to hold data or from a new block stripe built by build block stripes function 320. In a preferred embodiment, the page stripe allocation can be based on the health of the blocks available for allocation and the "heat" (i.e., estimated or measured write access frequency) of the LBA of the write data. Data placement function 310 then writes the write data, associated metadata (e.g., cyclic redundancy code (CRC) and error correcting code (ECC) values), and parity information for the page stripe in the allocated page stripe. Flash controller 140 also updates LPT table 300 to associate the physical page(s) utilized to store the write data with the LBA(s) indicated by the host device. Thereafter, flash controller 140 can access the data to service host read IOPs by reference to LPT table 300 as further illustrated in FIG. 3.

Once all pages in a block stripe have been written, flash controller 140 places the block stripe into one of occupied block queues 302, which flash management code running on the GPP 132 utilizes to facilitate garbage collection. As noted above, through the write process, pages are invalidated, and therefore portions of the NAND flash memory system 150 become unused. The associated flash controller 140 (and/or GPP 132) eventually needs to reclaim this space through garbage collection performed by a garbage collector 312. Garbage collector 312 selects particular block stripes for garbage collection based on a number of factors including, for example, the health of the blocks 204 within the block stripes and how much of the data within the erase blocks 204 is invalid. In the illustrated example, garbage collection is performed on entire block stripes, and flash management code running on GPP 132 logs the block stripes ready to be recycled in a relocation queue 304, which can conveniently be implemented in the associated flash controller memory 142 or GPP memory 134.

The flash management functions performed by GPP 132 or flash controller 140 additionally include a relocation function 314 that relocates the data held in block stripes enqueued in relocation queue 304. To relocate such data, relocation function 314 updates LPT table 300 to remove the current association between the logical and physical addresses of the data. In addition, relocation function 314 issues relocation write requests to data placement function 310 to request that the valid data of the old block stripe be written to a new block stripe in NAND flash memory system 150. Once all remaining valid data has been moved from the old block stripe, the old block stripe is passed to dissolve block stripes function 316, which decomposes the old block stripe into its constituent blocks 204, thus disassociating the blocks 204. Each of the blocks 204 formerly forming the dissolved block stripe is then erased under the direction of flash controller 140 and/or the control circuitry 205 of the relevant flash memory module 200, and a corresponding program/erase (P/E) cycle count for each erased block is incremented. Based on the health metrics of each erased block 204 (e.g., bit error rate (BER) metrics, uncorrectable errors, P/E cycle count, etc.), each erased block 204 is either retired (i.e., withdrawn from use) by a block retirement function 318 among the flash management functions executed on GPP 132, or alternatively, prepared for reuse by placing the block 204 on the appropriate ready-to-use (RTU) queue 306 in the associated GPP memory 134.

Figure 3:
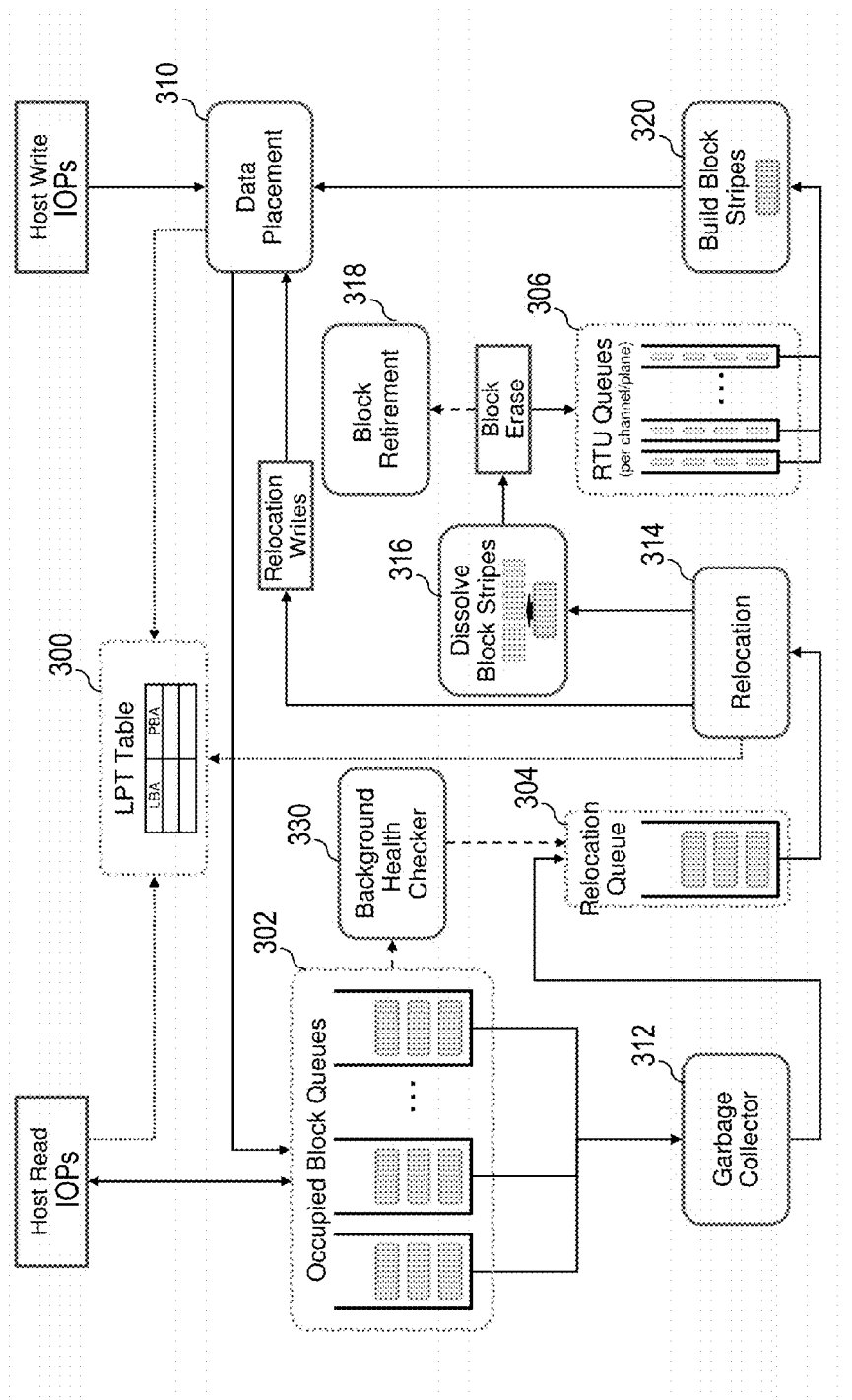
FIG. 3 is a high level flow diagram of the flash management functions and data structures employed in flash management in accordance with one embodiment.

As further shown in FIG. 3, the flash management functions executed on GPP 132 and/or flash controller 140 additionally include a background health checker 330. Background health checker 330, which operates independently of the read and write IOPs of hosts such as processor systems 102, continuously determines one or more metrics of health for blocks belonging to block stripes recorded in occupied block queues 302. Based on the one or more of the health metrics, background health checker 330 places block stripes on relocation queue 304 for handling by relocation function 314. Key health metrics preferably monitored and recorded by background health checker relate to the bit error rate (BER) metrics observed for valid blocks and physical pages, and may include, for example, the worst page BER of each block, the mean page BER of each block, the rates of change of the worst page BER and mean page BER of each block, etc. In order to obtain the most accurate health estimate possible, health can be determined from an analysis of valid and invalid data, thereby ensuring that blocks containing almost entirely invalid data are fully analyzed to determine overall block health.

Referring now to FIGS. 4-5, there are depicted exemplary embodiments of compressor 144 and decompressor 146 of FIG. 1B in accordance with one embodiment. In the illustrated embodiment, compressor 144 and decompressor 146 implement pseudo-dynamic compression and decompression techniques that utilize K predetermined prefix codes that are determined independently from and in advance of receipt of the data to be compressed.

As shown in FIG. 4, compressor 144 receives input user data, which can be, for example, one or more 4 kB data pages of write data received from a processor system 102 in a host write TOP. The user data is initially received and encoded by an LZ77 encoder 400, which, as known in the art, produces a sequence of literals and (length, distance) pointers. Compressor 144 additionally includes a set of K counters 402, where K is a positive integer and each of the K counters 402 is uniquely associated with a respective one of K predetermined prefix codes. Counters 402 determine which of the K prefix codes will result in the shortest compressed encoding of the output of LZ77 encoder 400. A minimum selection circuit 404 receives the count values of the K counters 402 and outputs a code index identifying the prefix code associated with the counter 402 having the lowest count value. This code index, which can have of length of $\log_2(K)$ bits, is utilized to perform a look up of the code definition of the selected prefix code in a memory 406 that stores all K prefix codes. The code definition retrieved from memory 406 is then utilized by a prefix encoder 408 to encode the output of LZ77 encoder 400 to obtain and output the compressed data. Flash controller 140 can then store the compressed data in conjunction with the code index in its associated NAND flash memory system 150.

Decompressor 146 reverses the pseudo-dynamic compression process implemented by compressor 144. As shown in FIG. 5, the decompressor 146 receives the code index and compressed data produced by a compressor 144, for example, in response to flash controller 140 retrieving the compressed data from the associated NAND flash memory system 150 to satisfy a host read IOP. The code index is utilized to perform a look up in memory 500 of a code description of the prefix code identified by the code index. The code description identified by the code index is then utilized by prefix decoder 502 to partially decode the input compressed data. The partially decoded data output by prefix decoder 502 is then fully decoded by LZ77 decoder 504 to obtain the original user data, which flash controller 140 may then forward to a processor system 102.

Because the pseudo-dynamic compression architecture implemented by compressor 144 and decompressor 146 employs predetermined prefix codes (as opposed to the dynamic prefix codes utilized in conventional dynamic Huffman compression architectures), the data access latency attributable to reconstructing the Huffman prefix code is advantageously avoided, and the average response times are concomitantly improved. However, the compression ratio achieved by compressor 144 and the associated increase in the effective storage capacity of the storage media depends heavily on the set prefix codes that are implemented.

In accordance with one aspect of the present disclosure, control logic predetermines the prefix codes to be utilized in pseudo-dynamic compression and decompression (e.g., in compressor 144 and decompressor 146). In various embodiments, the control logic may be, for example, a controller of a data storage system, such as NAND flash-based data storage system 120 of FIG. 1A, a processing element of another data storage system, or a processing element of a data processing system (e.g., a processor of a processor system 102). In various embodiments, the control logic may be implemented in hardware (i.e., integrated circuitry), which in some embodiments can be programmable and/or may be configured by the processing of firmware and/or software. Further, the control logic can reside at and/or be distributed among multiple levels, including a system level (e.g., in system management controllers 123), an intermediate level (e.g., in RAID controllers 124) and/or lower level (e.g., within the GPP 132 and/or flash controller(s) of flash cards 126).

Figure 6:
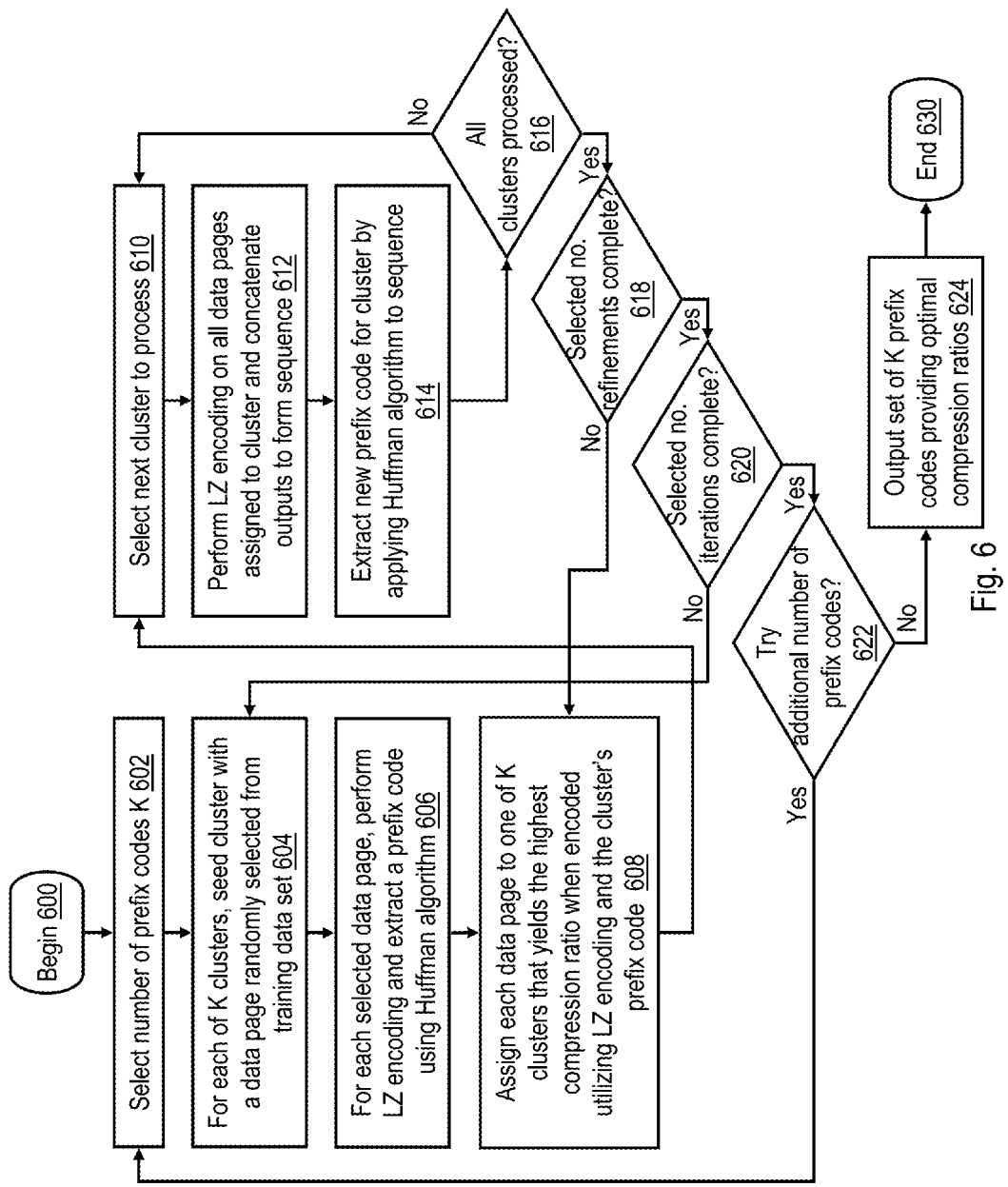
FIG. 6 is a high level logical flowchart of an exemplary process for determining prefix codes to be use in pseudo-dynamic compression and decompression in accordance with one embodiment.
Figure 7:
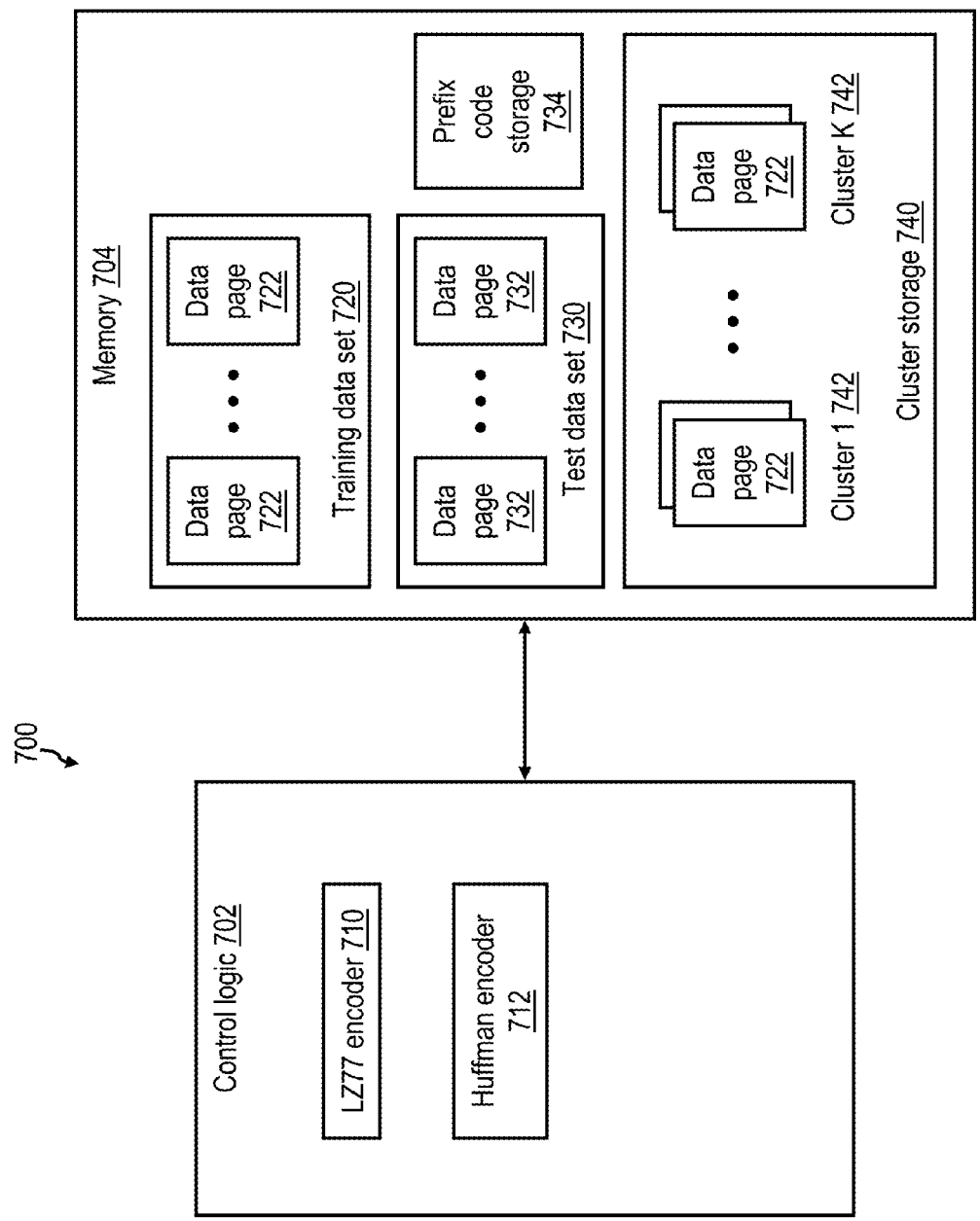
FIG. 7 illustrates an exemplary data processing system in accordance with one embodiment.

Referring now to FIG. 6, a high level logical flowchart of a exemplary process for determining prefix codes to be utilized in pseudo-dynamic compression and decompression is depicted. The illustrated process can be performed, for example, by control logic as described above. In some embodiments, the process of FIG. 6 can be implemented in advance of deployment of a data storage system 120, for example, by a manufacturer, reseller, or installer of data storage system 120. In other embodiments, the process of FIG. 6 can be dynamically performed subsequent to commercial deployment of a data storage system 120, for example, to optimize its performance for actual workloads. For ease of understanding, the process of FIG. 6 will be described with reference to the exemplary data processing system 700 of FIG. 7, which includes control logic 702 coupled to a memory 704.

The process of FIG. 6 begins at block 600 and then proceeds to block 602, which illustrates control logic 702 selecting a number K of prefix codes to be utilized in pseudo-dynamic compression, where K is a positive integer. In some embodiments, the number K of prefix codes selected at block 602 can be a power of two. For example, the initial number K of prefix codes selected at block 602 may be two, four, or eight. As described with reference to optional block 622 below, in at least some embodiments this initial number K of prefix codes can be increased in subsequent iterations of the process of FIG. 6. In some embodiments, the number K can also be bounded, for example, by the storage capacities of memories 406 and 500 available to store code descriptions of the K prefix codes.

At block 604, control logic 702 seeds each of K clusters 742 of data pages buffered in cluster storage 740 with a respective one of K data pages 722 randomly selected from a training data set 720. (In an alternative embodiment that provides improved memory efficiency, the K clusters 742 are formed of page indices of the corresponding data pages 722 of training data set 720 rather than data pages 722 themselves.) In one possible example, training data set 720, which preferably includes a multiplicity of data pages 722 (e.g., 4 kB data pages), may be a data set generated by a representative workload of an enterprise that will use or is using a data storage system 120. For each of the K randomly selected data pages 722, control logic 702 performs encoding with an LZ77 encoder 710 and extracts a first prefix code for the cluster from the randomly selected seed data page 722 using a conventional Huffman encoder 712 and stores the first prefix code in prefix code storage 734 (block 606). Block 608 illustrates control logic 702 assigning each remaining data page 722 in training data set 720 to which ever one of K clusters 742 that yields the highest compression ratio when encoded by LZ77 encoder 710 and then by Huffman encoder 712 utilizing the cluster's first prefix code. As appreciated by those skilled in the art, the highest compression ratio yields the smallest compressed size for the data page 722.

After the K clusters 742 are formed from data pages 722 from training data set 720, FIG. 6 enters a processing loop including blocks 610-616 in which control logic 702 updates the prefix code for each of the K clusters. As will be appreciated, in various embodiments the K iterations of the loop may be performed serially and/or in parallel. Referring first to block 610, control logic 702 selects a next (or first) cluster 742 to process at block 610. At block 612, control logic 702 utilizes LZ77 encoder 710 to encode all data pages 722 assigned to the selected cluster 742 and concatenates the outputs of the LZ77 encoding to form a single long sequence of literals and pointers. Control logic then utilizes Huffman encoder 712 to apply the Huffman algorithm to the sequence to extract a second prefix code for the selected cluster 742 from its associated sequence of literals and pointers (block 614). This second prefix code replaces the first prefix code in prefix code storage 734.

At block 616, control logic 702 determines if all clusters 742 have been processed. If not, the process of FIG. 6 performs blocks 610-614, for a next one of the K clusters 742 of data pages. In response to determining at block 616 that all K clusters 742 have been processed, the process proceeds to block 618, which depicts control logic 702 determining whether a selected number of refining iterations of the loop beginning at block 608 have been performed to generate a respective new prefix code for each cluster 742. In various embodiments, the number of refining iterations of the loop beginning at block 608 that are performed may be predetermined or determined based on a performance metric, such as the improvement in compression ratio achieved by the most recent iteration of the loop failing to exceed that of the immediate previous iteration by a threshold percentage. In response to a determination at block 618 that the selected number of refining iterations have not yet been performed, the process returns to block 608 and following blocks, which have been described. In response, however, to a determination at block 618 that the selected number of refining iterations have been performed, the process proceeds at block 620.

Block 620 depicts control logic 702 determining whether or not a selected number of iterations of the loop beginning at block 604 have been performed. In various embodiments, the number of iterations of the loop beginning at block 604 that are performed may be predetermined (e.g., 10 iterations) or determined based on a performance metric, such as the percentage improvement in compression ratio achieved by the most recent iteration of the loop. In response to a determination at block 620 that the selected number of iterations have not been performed, the process returns to block 604 and following blocks, which have been described. In response, however, to a determination at block 620 that the selected number of iterations have been performed, the process proceeds at block 622.

At block 622, control logic 702 additionally determines whether or not it should repeat the loop beginning at block 602 with a different number K of clusters and prefix codes. In one embodiment, the control logic increases the number K by a power of two (e.g., 2, 4, 8, 16, etc.) with each iteration of the loop beginning at block 602. The control logic then compresses a test data set 730 different than the training data set 720 with the currently selected number K of prefix codes and compares the compression ratio achieved with that achieved by the previous iteration of the loop, if any. In this embodiment, control logic 702 determines at block 622 that it should repeat the loop beginning at block 602 until no further improvement in compression ratio is achieved over test data set 730.

In response to an affirmative determination at block 622, the process returns to block 602 and following blocks, which have been described. In response, however, to a negative determination at block 622, the process proceeds to block 624. At block 624, control logic 702 outputs the K prefix codes determined by the process of FIG. 6 as providing the best compression ratio in memory 406. The output of the K prefix codes can include, for example, presenting the K prefix codes in a display, printing the K prefix codes, storing the K prefix codes in a memory, and/or transmitting the K prefix codes on a network. For example, outputting the K prefix codes can include setting the K prefix codes in memories 406 of the compressors 144 and memories 500 of the decompressors 146 of one or more data storage systems 120. Following block 624, the process of FIG. 6 thereafter ends at block 630.

As has been described, in at least one embodiment, a set of K prefix codes for use in pseudo-dynamic compression are determined by seeding each of K clusters with a respective one of K data pages selected from a training data set, where K is a positive integer greater than 1. For each of the K randomly selected data pages, a prefix code is determined for its cluster utilizing Huffman encoding. Each remaining data page of the training data set is assigned to one of the K clusters whose prefix code yields the highest compression ratio. For each of the K clusters, the prefix code is updated by performing Lempel-Ziv (LZ) encoding on all pages assigned to that cluster, forming a sequence from results of the LZ encoding, and extracting an updated prefix code for the cluster from the sequence utilizing Huffman encoding. The set of K prefix codes determined for the K clusters is then output.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude signal media per se, transitory propagating signals per se, and energy per se.

In addition, although embodiments have been described that include use of a NAND flash memory, it should be appreciated that embodiments of the present invention can also be used with any other type of non-volatile random access memory (NVRAM).

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method for determining parameters for data compression, the method comprising:
    determining a set of K prefix codes for pseudo-dynamic compression, wherein the determining includes:
        seeding each of K clusters with a respective one of K data pages selected from a training data set, wherein K is a positive integer greater than 1;
        for each of the K randomly selected data pages, determining a prefix code for its cluster utilizing Huffman encoding;
        assigning each remaining data page of the training data set to one of the K clusters whose prefix code yields the highest compression ratio; and
        for each of the K clusters, updating the prefix code by performing Lempel-Ziv (LZ) encoding on all pages assigned to that cluster, forming a sequence from results of the LZ encoding, and extracting an updated prefix code for the cluster from the sequence utilizing Huffman encoding; and
    outputting the set of K prefix codes determined for the K clusters.

2. The method of claim 1, wherein the outputting includes setting the K prefix codes in a pseudo-dynamic compressor of a data storage system.

3. The method of claim 1, wherein:
    the method further includes repeating the determining step for multiple different values of K to obtain multiple different sets of prefix codes; and the outputting comprises outputting a set of K prefix codes providing a highest compression ratio.

4. The method of claim 3, and further comprising:
determining the compression ratio for each of the multiple different sets of prefix codes utilizing a test data set different from the training data set.

5. The method of claim 1, wherein:
the method further includes repeating the seeding in each of multiple iterations of the determining step for a same value of K; and
the outputting comprises outputting a set of K prefix codes providing a highest compression ratio.

6. The method of claim 1, wherein:
the method further includes repeating the assigning and updating in each of multiple iterations of the determining step for a same value of K; and
the outputting comprises outputting a set of K prefix codes providing a highest compression ratio.

7. The method of claim 1, wherein the determining and outputting are performed by control logic of a data storage system dynamically during operation of data storage system.

8. A data processing system, comprising:
control logic configured to perform:
determining a set of K prefix codes for pseudo-dynamic compression, wherein the determining includes:
seeding each of K clusters with a respective one of K data pages selected from a training data set, wherein K is a positive integer greater than 1;
for each of the K randomly selected data pages, determining a prefix code for its cluster utilizing Huffman encoding;
assigning each remaining data page of the training data set to one of the K clusters whose prefix code yields the highest compression ratio; and
for each of the K clusters, updating the prefix code by performing Lempel-Ziv (LZ) encoding on all pages assigned to that cluster, forming a sequence from results of the LZ encoding, and extracting an updated prefix code for the cluster from the sequence utilizing Huffman encoding; and
outputting the set of K prefix codes determined for the K clusters.

9. The data processing system of claim 8, wherein the control logic sets the K prefix codes in a pseudo-dynamic compressor of a data storage system.

10. The data processing system of claim 8, wherein:
the control logic is configured to repeat the determining for multiple different values of K to obtain multiple different sets of prefix codes; and
the control logic outputs a set of K prefix codes providing a highest compression ratio.

11. The data processing system of claim 10, wherein the control logic is further configured to perform:
determining the compression ratio for each of the multiple different sets of prefix codes utilizing a test data set different from the training data set.

12. The data processing system of claim 8, wherein:
the control logic is configured to repeat the seeding in each of multiple iterations of the determining for a same value of K; and
the control logic outputs a set of K prefix codes providing a highest compression ratio.

13. The data processing system of claim 8, wherein:
the control logic is configured to repeat the assigning and updating in each of multiple iterations of the determining step for a same value of K; and
the control logic outputs a set of K prefix codes providing a highest compression ratio.

14. The data processing system of claim 8, wherein:
the control logic comprises a controller of a data storage system; and
the controller performs the determining dynamically during operation of data storage system.

15. A computer program product, the computer program product comprising a computer readable storage medium having program instructions embodied therewith, the program instructions executable by control logic to cause the control logic to perform:
determining a set of K prefix codes for pseudo-dynamic compression, wherein the determining includes:
seeding each of K clusters with a respective one of K data pages selected from a training data set, wherein K is a positive integer greater than 1;
for each of the K randomly selected data pages, determining an prefix code for its cluster utilizing Huffman encoding;
assigning each remaining data page of the training data set to one of the K clusters whose prefix code yields the highest compression ratio; and
for each of the K clusters, updating the prefix code by performing Lempel-Ziv (LZ) encoding on all pages assigned to that cluster, forming a sequence from results of the LZ encoding, and extracting an updated prefix code for the cluster from the sequence utilizing Huffman encoding; and
outputting the set of K prefix codes determined for the K clusters.

16. The program product of claim 15, wherein the outputting includes setting the K prefix codes in a pseudo-dynamic compressor of a data storage system.

17. The program product of claim 15, wherein:
the program instructions, when executed, further cause the control logic to perform repeating the determining for multiple different values of K to obtain multiple different sets of prefix codes; and
the outputting comprises outputting a set of K prefix codes providing a highest compression ratio.

18. The program product of claim 17, the program instructions, when executed, further cause the control logic to perform:
determining the compression ratio for each of the multiple different sets of prefix codes utilizing a test data set different from the training data set.

19. The program product of claim 15, wherein:
the program instructions, when executed, further cause the control logic to perform repeating the seeding in each of multiple iterations of the determining for a same value of K; and
the outputting comprises outputting a set of K prefix codes providing a highest compression ratio.

20. The program product of claim 15, wherein:
the program instructions, when executed, further cause the control logic to perform repeating the assigning and updating in each of multiple iterations of the determining for a same value of K; and
the outputting comprises outputting a set of K prefix codes providing a highest compression ratio.

* * * * *